United States Patent [19]

Shubat et al.

[11] Patent Number: 5,432,730
[45] Date of Patent: Jul. 11, 1995

[54] ELECTRICALLY PROGRAMMABLE READ ONLY MEMORY ARRAY

[75] Inventors: Alex Shubat, Fremont, Calif.; Boaz Eitan, Ra'anana, Israel

[73] Assignee: Waferscale Integration, Inc., Fremont, Calif.

[21] Appl. No.: 170,130

[22] Filed: Dec. 20, 1993

[51] Int. Cl.$^6$ .............................................. H01L 29/78
[52] U.S. Cl. .................................... 365/63; 365/94; 365/51; 365/104; 365/185; 257/202
[58] Field of Search ............... 365/185, 104, 63, 94, 365/51; 257/204, 208, 202

[56] References Cited

U.S. PATENT DOCUMENTS

| | | | |
|---|---|---|---|
| 4,267,632 | 5/1981 | Shappir | 29/571 |
| 5,021,999 | 6/1991 | Kohda et al. | 365/185 |
| 5,126,808 | 6/1992 | Montalvo et al. | 357/23.5 |
| 5,151,375 | 9/1992 | Kazerounian et al. | 437/43 |
| 5,204,835 | 4/1993 | Eitan | 365/185 |

OTHER PUBLICATIONS

W. Kammerer et al., "A New Virtual Ground Array Architecture For Very High Speed, High Density EPROMS", VLSI Circuits Symposium, Japan, 1991.

*Primary Examiner*—Joseph A. Popek
*Assistant Examiner*—Vu Le
*Attorney, Agent, or Firm*—Kriegsman & Kriegsman

[57] ABSTRACT

There is provided an EPROM array including columns of EPROM cells, three types of diffusion bit lines, two types of metal lines and two types of select transistors. The metal lines are formed of metal 1 lines and metal 2 lines, where the metal 1 lines are formed into segmented lines and continuous lines and the metal 2 lines are continuous. The diffusion bit lines are formed of short, medium and continuous lines, where the medium length diffusion lines are associated with one segmented metal 1 line and one metal 2 line, the continuous lines are associated with one continuous metal 1 line and the short bit lines are formed of short segments and are not associated with metal lines. The diffusion lines repeat in the following order: medium length, short, continuous, short. One type of select transistor connects one short diffusion line to one metal 1 line and the second type of select transistor connects one segmented metal 1 line to one metal 2 line. Each column of EPROM cells are located between two neighboring diffusion lines.

8 Claims, 15 Drawing Sheets

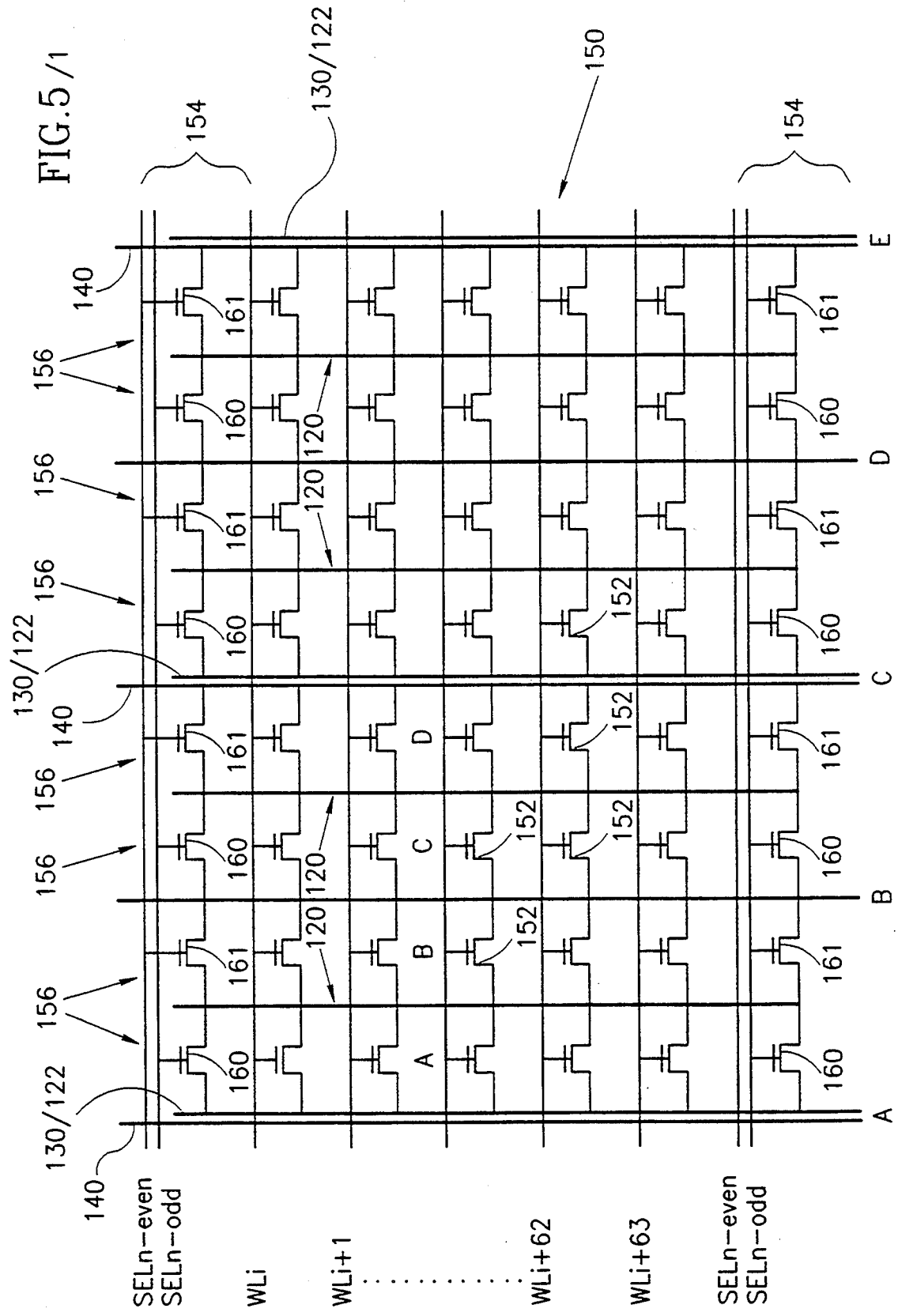

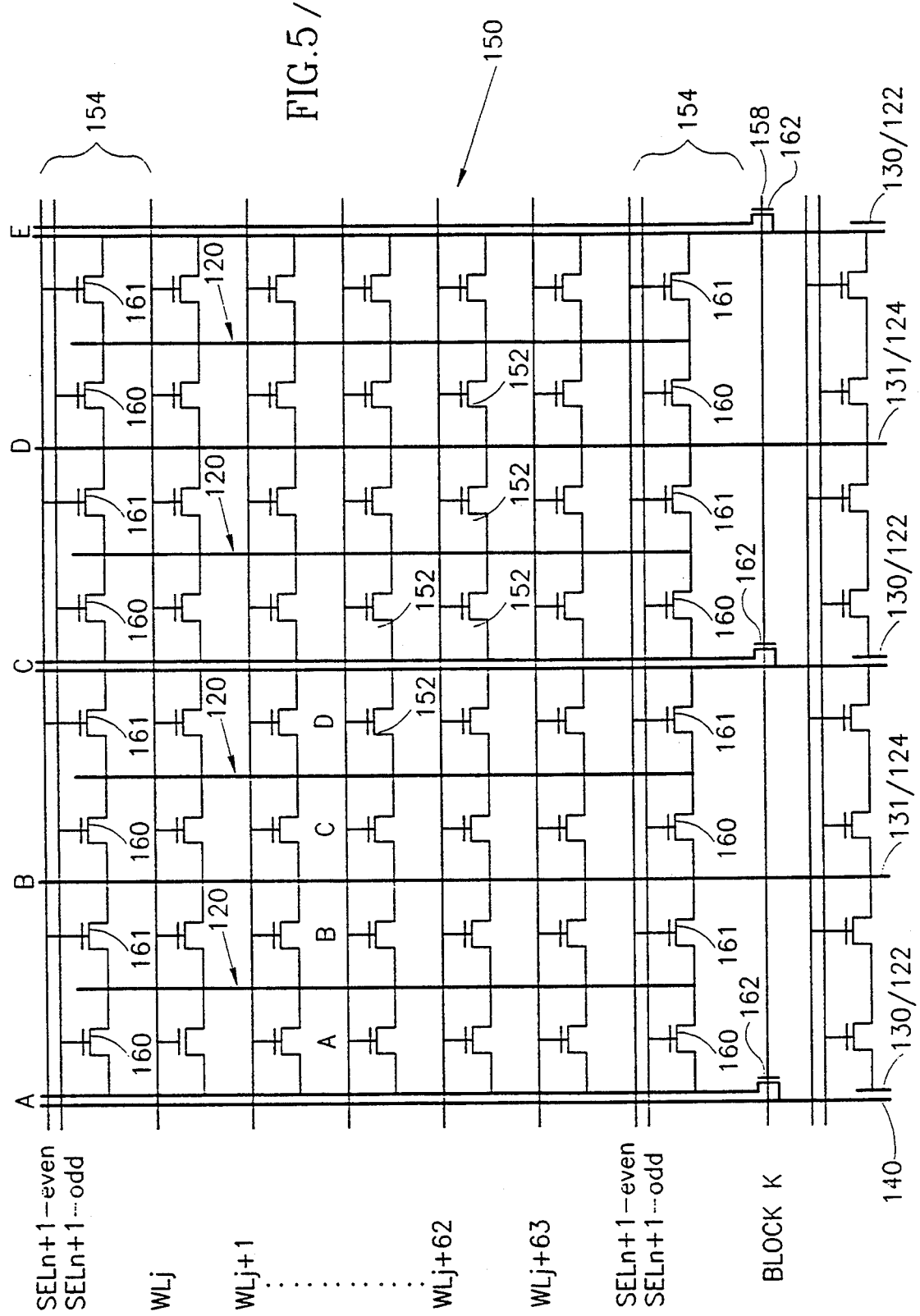
FIG. 5/2

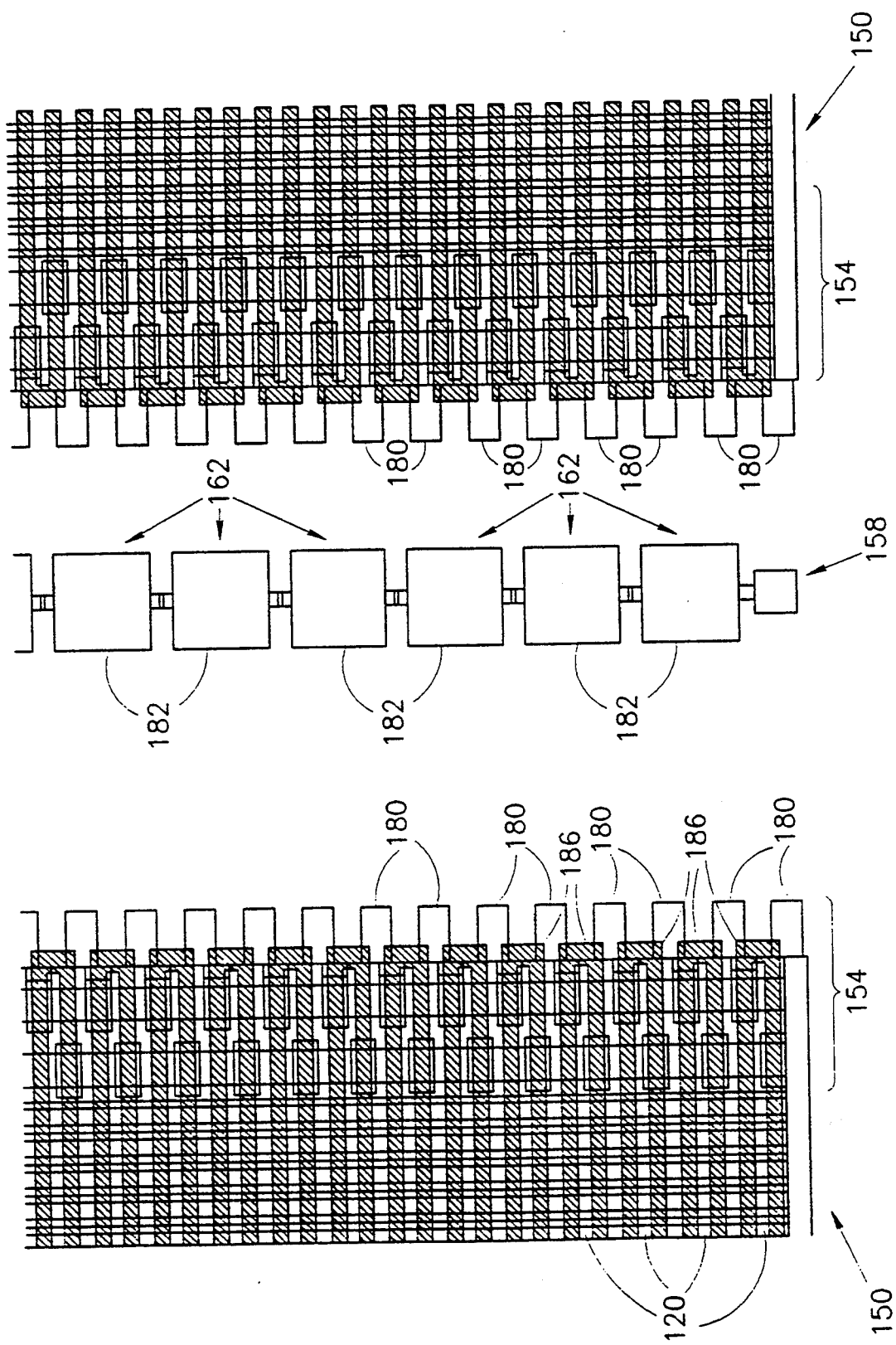

ELECTRICALLY PROGRAMMABLE READ ONLY MEMORY ARRAY

FIELD OF THE INVENTION

The present invention relates to electrically programmable read only memory (EPROM) arrays generally and to EPROM arrays having high density and improved speed in particular.

BACKGROUND OF THE INVENTION

EPROMs and electrically erasable programmable read only memory (EEPROM) arrays are basic building blocks of microprocessor systems. The EPROM and EEPROM arrays are comprised of a plurality of EPROM or EEPROM cells, each of which must be individually activatable.

Over the years, EPROM and EEPROM arrays have been continually improved, both in speed and in density, thereby to enable the microprocessor systems to run complicated programs at faster speeds. Different architectures provide different densities and different operating speeds, where typically an improvement in speed comes at a cost of reduced density, and vice versa.

Some types of EPROM arrays are common source arrays, virtual ground arrays, partitioned virtual ground arrays and alternate metal virtual ground arrays. Some types of EEPROM arrays are common source arrays and virtual ground arrays.

A virtual ground architecture is described in U.S. Pat. No. 4,267,632. In the '632 patent, a first plurality of parallel spaced-apart, polycrystalline silicon ("polysilicon") lines is defined on one surface of, but insulated from, the silicon semiconductor substrate. Parallel, spaced apart doped regions ("diffusion bit lines") are formed in the silicon substrate between these first polysilicon ("poly 1") lines and in alignment with these lines. A second plurality of parallel, spaced-apart, polysilicon lines ("poly 2"), insulated from the poly 1 lines and the diffusion bit lines in the substrate, is formed perpendicular to the poly 1 lines and the diffusion bit lines. The poly 2 lines are then used as an etch mask to remove those portions of the poly 1 lines not covered by the poly 2 lines. The portions of the poly 1 lines remaining beneath the poly 2 lines are located between the diffusion bit lines and are the floating gates of the EPROM transistors, or cells.

While the '632 patent yields a plurality of floating gate devices in a relatively high density array, the cell size is still larger than desired. One reason for this is that one metal line is formed above each elongated diffusion bit line. Consequently, the size of the array is increased both by the widths of these metal lines and by the need to have numerous contacts between such metal lines and the underlying elongated diffusion bit lines. Since the contacts are of the size of the metal lines and the metal lines must go around the contacts, the area near the contacts is wider than the metal lines themselves.

In addition, having a symmetrical transistor (source and drain are interchangeable) complicates the programming function in virtual ground arrays.

Furthermore, when reading a selected EPROM cell, the diffusion bit line which is the drain is pre-charged to a predetermined level and the EPROM cell is read by removing charge from the drain line. It will be appreciated by those skilled in the art that the reading time is inversely dependent on the capacitance of the drain line and that the capacitance of each drain line is a function of the accumulation of the capacitance of the many EPROM cells attached to it.

Reference is now made to FIGS. 1A and 1B which illustrate a partitioned virtual ground architecture described in the article "A New Virtual Ground Array Architecture for Very High Speed, High Density EPROMs", presented at the 1991 VLSI Circuits Symposium, Japan by W. Kammerer, et al, employees of the common assignees of the present invention.

In this architecture, there are two types of alternating diffusion bit lines, segmented ones 22 and continuous ones 24. The segmentation is provided in order to reduce bit line capacitance and achieve thereby a high operating speed.

Each diffusion bit line 22 or 24 is associated with a metal line 20 or 21, respectively, and a contact 28 or 30, respectively. The segmented diffusions 22 are connected to the metal lines 20 and contacts 28 via n-channel select transistors 26.

The n-channel transistors 26 and contacts 28 are located in one area of the array and the contacts 30 are placed in a second area of the array, thereby to minimize the amount of space they utilize. The pitch of the partitioned virtual ground architecture is limited by the width of the transistor 26 and, due to the staggering of the contacts 28 and 30, by one-half contact 28 or 30.

Typically, developments in EPROM manufacturing processes have not decreased the metal pitch as much as the pitch of the poly 1 and poly 2 layers. Since the metal pitch is considerably larger than the minimum dimension of an EPROM cell and since the partitioned virtual ground architecture has one metal line per cell, the metal pitch is the limiting factor in the size of each cell.

To achieve a maximal operating speed during a read operation, the sensed bit line must have the least capacitance and therefore, must be one of the segmented diffusions 22. As a result, for reading, the segmented diffusions 22 are dedicated read lines and the continuous diffusions 24 are dedicated source lines. However, for programming, the arrangement described hereinabove does not work since the n-channel transistors 26 cannot transfer the high voltage and high current required to program a cell. Therefore, during programming, the continuous diffusions 24 are dedicated to serve as high voltage terminals and the segmented diffusions 22 are dedicated to serve as source terminals.

Segmentation is also utilized for separating a flash EEPROM array into a plurality of isolated EEPROM areas. The data in one EEPROM area can then be individually erased without affecting the data in the other EEPROM areas. This architecture is described in U.S. Pat. No. 5,126,808, a copy of whose FIG. 5 is presented herein as FIG. 2 to whom reference is now made.

The segmented flash EEPROM architecture includes a plurality of EEPROM pages 100-k, each comprised of a multiplicity of EPROM cells (ki,j), where k indicates the page number, i the row number and j the column number. The EEPROM cells (ki,j) are common ground array flash EEPROM transistors, wherein the sources S are connected to each other and to a ground signal.

The drain bit lines D are strapped by segmented metal lines BLk-j of a first metal layer. The metal line segments BLkj are the local bit lines. The segmented metal lines of a page k are connected to continuous second metal lines BLk, which are global bit lines, through n-channel select transistors (i,j). Due to the use of the local bit lines, only one local block k is connected to the global bit line at any one time. If there are eight local blocks and bit lines, this segmentation reduces the bit line capacitance by a factor of 8.

However, before an EPROM or EEPROM cell can be read, its drain must be pre-charged to a certain level. If no voltage is applied to a page of an EPROM or EEPROM array, the level of charge will slowly decay. Therefore, in the flash EEPROM architecture of U.S. Pat. No. 5,126,808, each page must first be pre-charged before the data stored therein can be sensed. This reduces the operating speed.

The flash EEPROM architecture described in U.S. Pat. No. 5,126,808 has one metal line and one contact for every diffusion bit line. Thus, the area of the flash EEPROM array of U.S. Pat. No. 5,126,808 is large and is limited by the metal pitch.

If there were only one metal line for every two diffusion bit lines and a contact, the limiting factor would not be the metal pitch, but rather the pitch of the polysilicon layers. This is known as a "poly pitch limited" architecture. One architecture which has only one such metal line is that of the alternating metal virtual ground EPROM array, described in U.S. Pat. Nos. 5,204,835 and 5,151,375, assigned to the common assignees of the present invention, and illustrated in FIG. 3 to which reference is now made.

The EPROM array of U.S. Pat. Nos. 5,151,375 and 5,204,835 comprises an EPROM area 50 comprising a plurality of EPROM transistors 52, or cells, surrounded by two "control areas" 54 comprising control elements, detailed hereinbelow.

In the EPROM area 50, each cell 52 comprises a gate 56, a source 58 and a drain 60. The sources 58 of a column of EPROM cells 52 together form non-metal-strapped, segmented diffusion bit lines, labeled S−1, S and S+1. The drains 60 of a column of EPROM cells 52 together form metal-strapped, continuous diffusion bit lines labeled M−1, M and M+1. Segmented bit lines S−1, S and S+1 typically connect together N EPROM cells 52, where N is typically 64. The gates 56 of a row of cells are connected to one word line WL1.

Each control area 54 comprises select transistors 62, contacts 66 and select lines SELn and SEL(n+1). Select transistors 62 are typically stacked gate transistors but can also be n-channel devices. One contact 26 is connected to each bit line M−1, M or M+1 in each control area 54.

A pair of select transistors 62 from two neighboring control areas 54 are operative, when activated by the appropriate select lines SELn or SEL(n+1), to connect one segmented diffusion bit line S−1, S or S+1 to a neighboring continuous diffusion bit line M−1, M or M+1.

In order to access the EPROM cell labeled 52a, the following lines are activated: word line WL1, select lines SEL(n+1) and bit lines M and M−1. Bit line M receives the drain voltage and bit line M−1 receives the source voltage, which is typically a ground voltage. The select transistors 62 which are activated by select lines SEL(n+1) transfer the source voltage from bit line M−1 to the segment S−1. Word line WL1 activates a row of EPROM cells and bit lines M and M−1 activate a column of cells, thereby activating only EPROM cell 52a, which sits at the intersection of the activated row and column. The output of the EPROM cell 52a is provided through the contact 66 which is connected to the appropriate bit line.

In order to access the EPROM cell labeled 52b, voltage is placed on word line WL1, select lines SELn and metal strapped bit lines M−1 and M. Metal strapped bit lines M−1 and M become the drain and source, respectively, wherein the source is transferred to segment S−1 through the select transistors 62a.

It is noted that the source is always transferred to the segment lines Sj. It can be seen that the metal strapped bit lines Mj act as sources whenever they are connected to a segment line and as drains otherwise.

It will further be appreciated that, when the select lines SEL(n+1) activate a row of select transistors 62, they connect each bit line Mj with a segmented bit line Sj. Thus, when reading EPROM cell 52a, metal strapped bit line M−1 is connected, through the select transistor labeled 62a, to the segmented bit line S−1. This transfers the source to bit line S−1. At the same time, metal strapped bit line M (the drain) is connected, through the select transistor labeled 62b, to the segmented bit line S. Thus, the capacitance of the drain line is the sum of capacitance of the metal strapped bit line M plus the capacitance of the segmented bit line S connected to it. The overall bit line capacitance in this architecture has no advantages or disadvantages relative to other prior art architectures. It has a smaller area but adds capacitance due to the fact that the diffusions are continuous across the array.

Therefore, although the alternating metal virtual ground architecture described in U.S. Pat. Nos. 5,204,835 and 5,151,375 has a very high density, its operating speed is slower than desired, due to the extensive capacitance of the operative drain line.

SUMMARY OF THE PRESENT INVENTION

It is therefore an object of the present invention to provide a high density, high speed EPROM array architecture which is also generally poly pitch limited.

There is therefore provided, in accordance with a preferred embodiment of the present invention, an EPROM array including columns of EPROM cells, three types of diffusion bit lines, two types of metal lines and two types of select transistors.

The metal lines are formed of metal 1 lines and metal 2 lines, where the metal 1 lines are formed into segmented lines and continuous lines and the metal 2 lines are continuous. The diffusion bit lines are formed of short, medium and continuous lines, where the medium length diffusion lines are associated with one segmented metal 1 line and one metal 2 line, the continuous lines are associated with one continuous metal 1 line and the short bit lines are formed of short segments and are not associated with metal lines. The diffusion lines repeat in the following order: medium length, short, continuous, short.

One type of select transistor connects one short diffusion line to one metal 1 line and the second type of select transistor connects one segmented metal 1 line to one metal 2 line. Each column of EPROM cells are located between two neighboring diffusion lines.

Additionally, in accordance with a preferred embodiment of the present invention, when accessing a single EPROM cell, read and source lines are selected as any neighboring continuous and medium length diffusion lines. During reading, the neighboring continuous diffusion line is set to be the source line and the neighboring medium length diffusion line is set to be the drain line. The short diffusion line is connected to either of the source and drain lines, depending on which EPROM cell is to be accessed. During programming, the short diffusion line is always connected to the source line which can be either the neighboring medium length diffusion line or the neighboring continuous diffusion line, depending on which EPROM cell is to be accessed.

Moreover, in accordance with a preferred embodiment of the present invention, the columns of EPROM cells are formed into four groups and the array additionally includes a controller for controlling the read and program directions of the groups of columns. There are two directions and the reading and programming are both performed in each direction. Thus, four groups of columns are produced, each one having a different combination of reading and programming directions.

BRIEF DESCRIPTION OF THE DRAWINGS

The present invention will be understood and appreciated more fully from the following detailed description taken in conjunction with the drawings in which:

FIG. 5 is a circuit diagram illustration of the architecture of the EPROM array of the present invention;

FIGS. 7A, 7B and 7C are layout illustrations for a block select area, corresponding to the layers in the schematic illustrations of FIGS. 4A, 4B and 4C, respectively;

DETAILED DESCRIPTION OF A PREFERRED EMBODIMENT

Figure 1A:
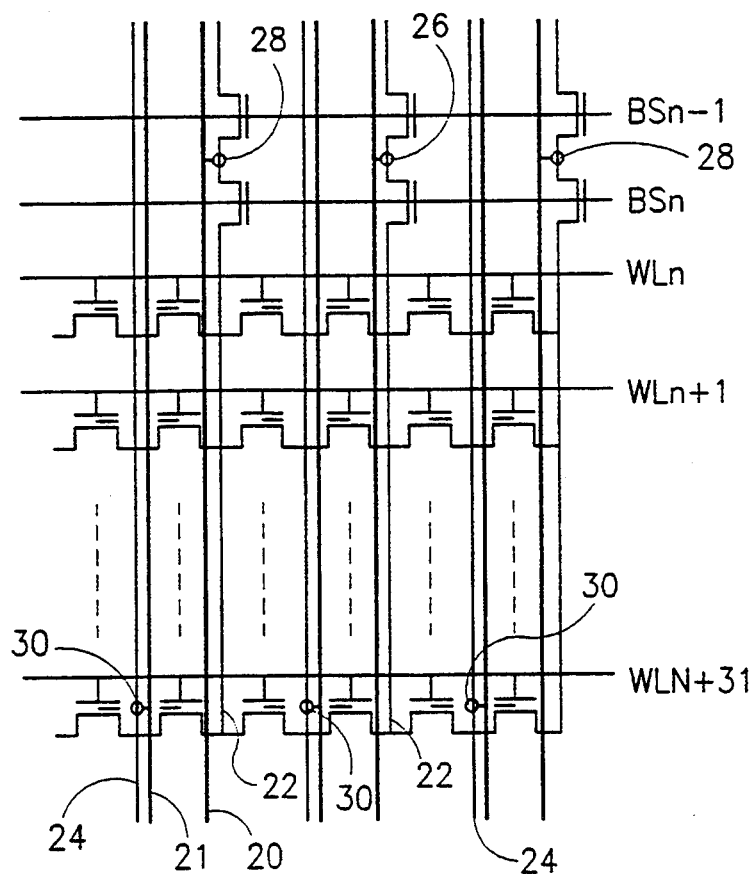
FIGS. 1A and 1B are circuit diagram and layout illustrations, respectively, of a prior art virtual ground EPROM architecture.
Figure 1B:
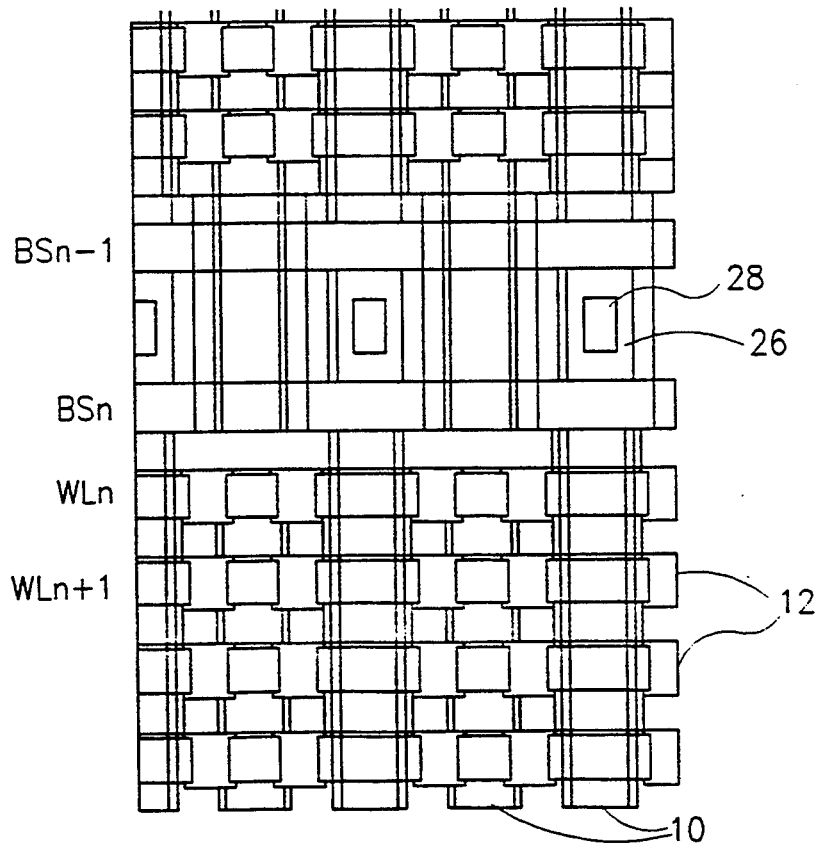
Figure 2:
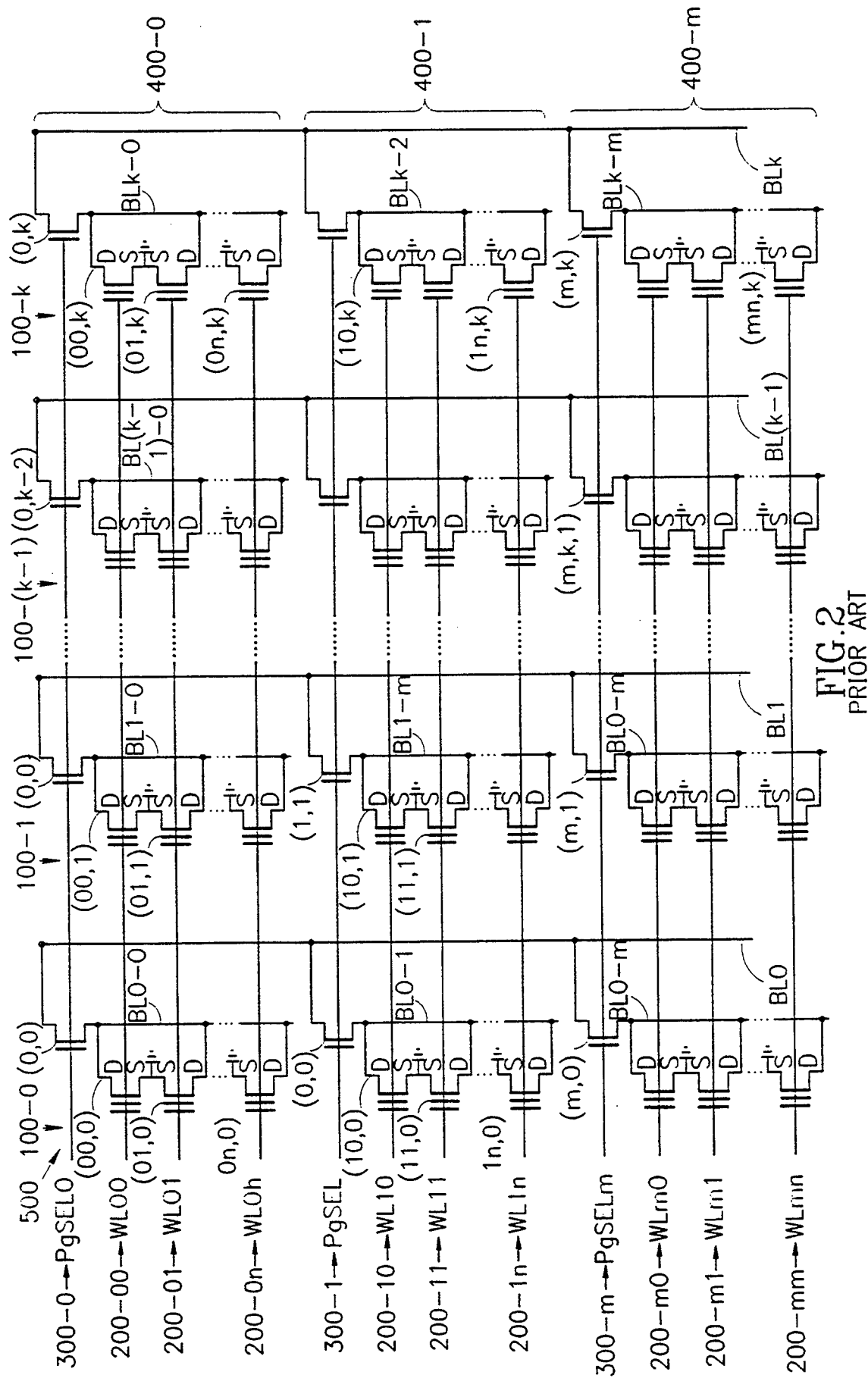
FIG. 2 is a circuit diagram illustration of a prior art segmented EEPROM architecture.
Figure 3:
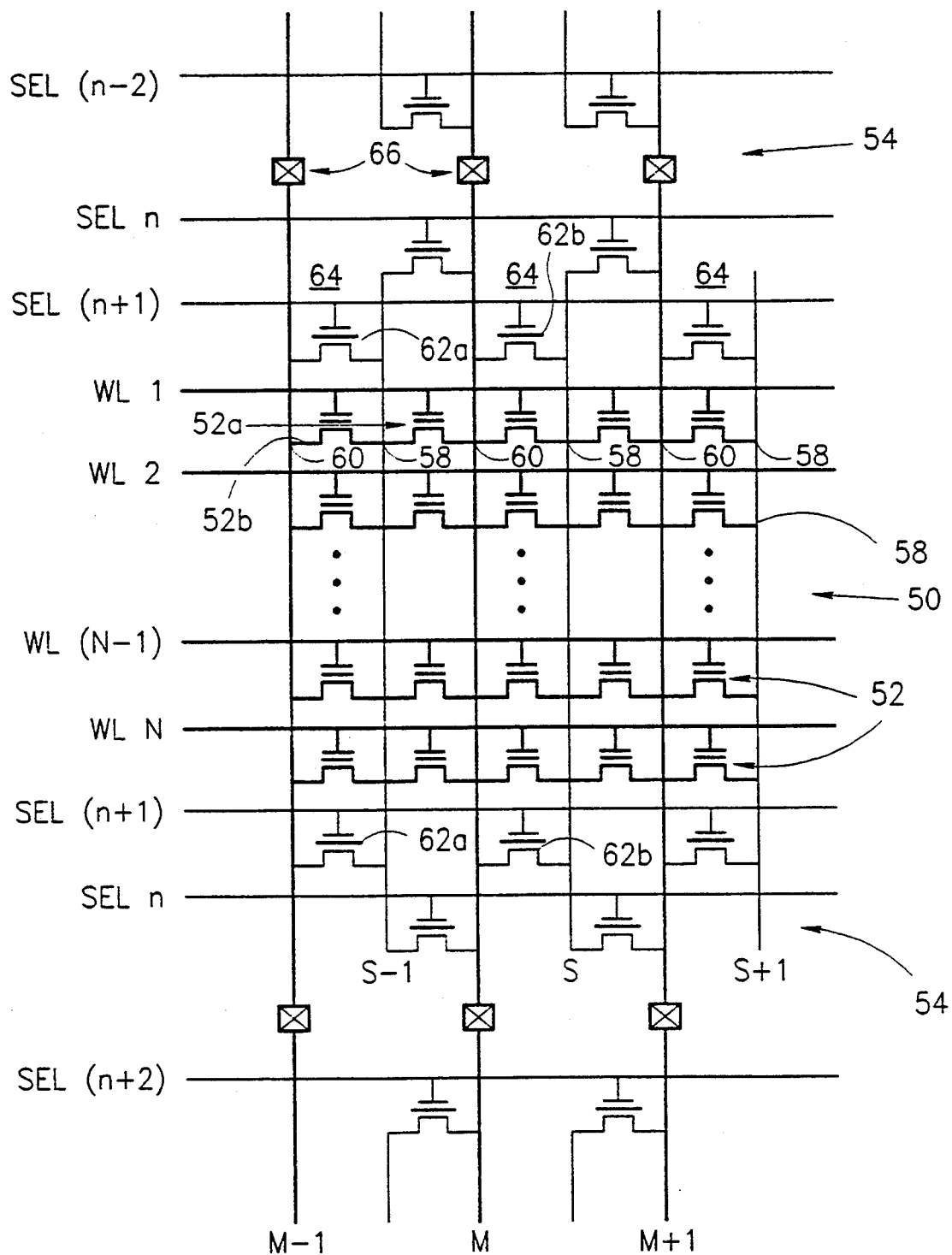
FIG. 3 is a circuit diagram illustration of a prior art alternating metal ground architecture.
Figure 4A:
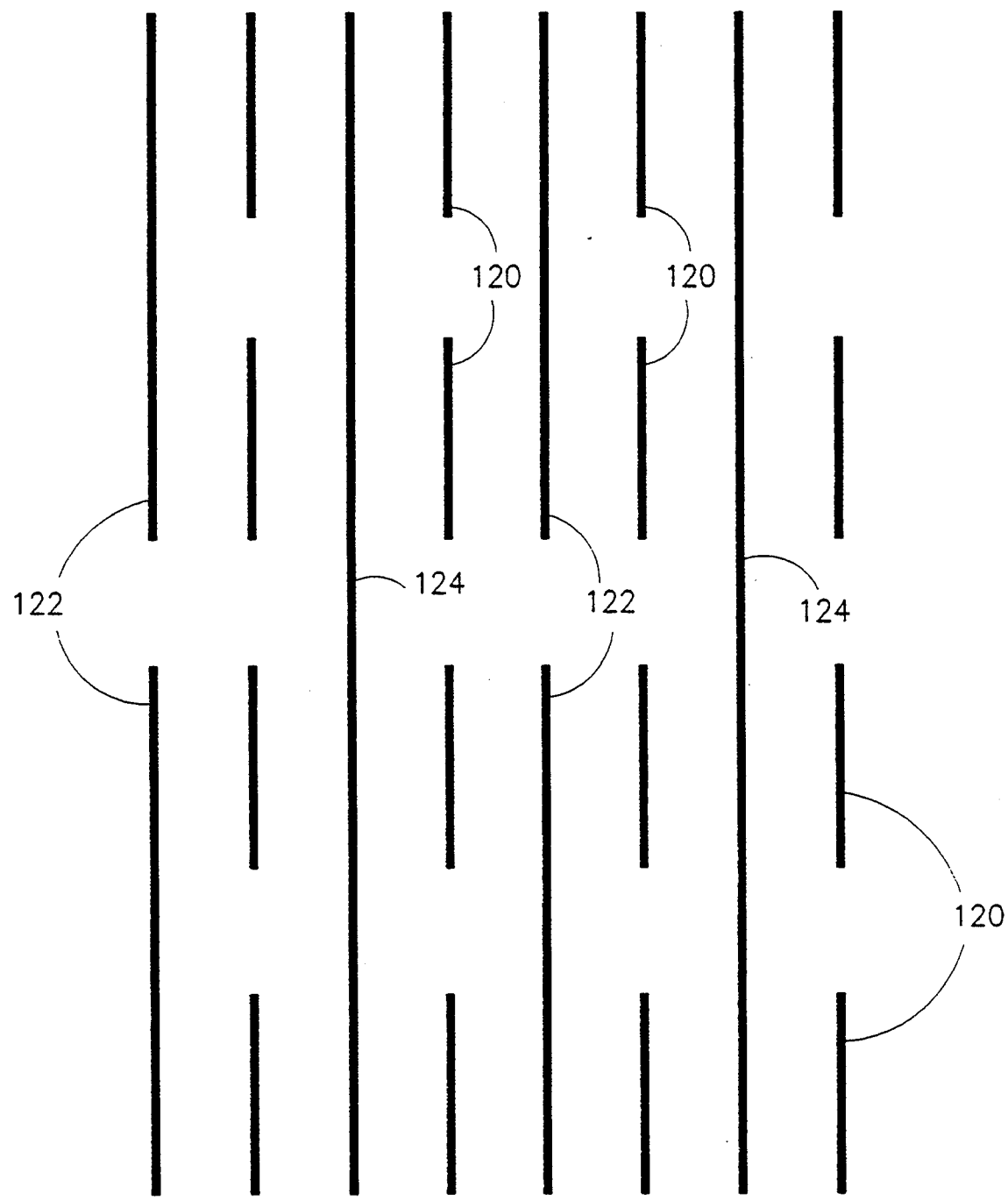
FIGS. 4A, 4B and 4C are schematic illustrations of layers of an EPROM array constructed and operative in accordance with a preferred embodiment of the present invention, from the lowest, diffusion layer to a second metal layer, where the later illustrations also include the previous layers.
Figure 4B:
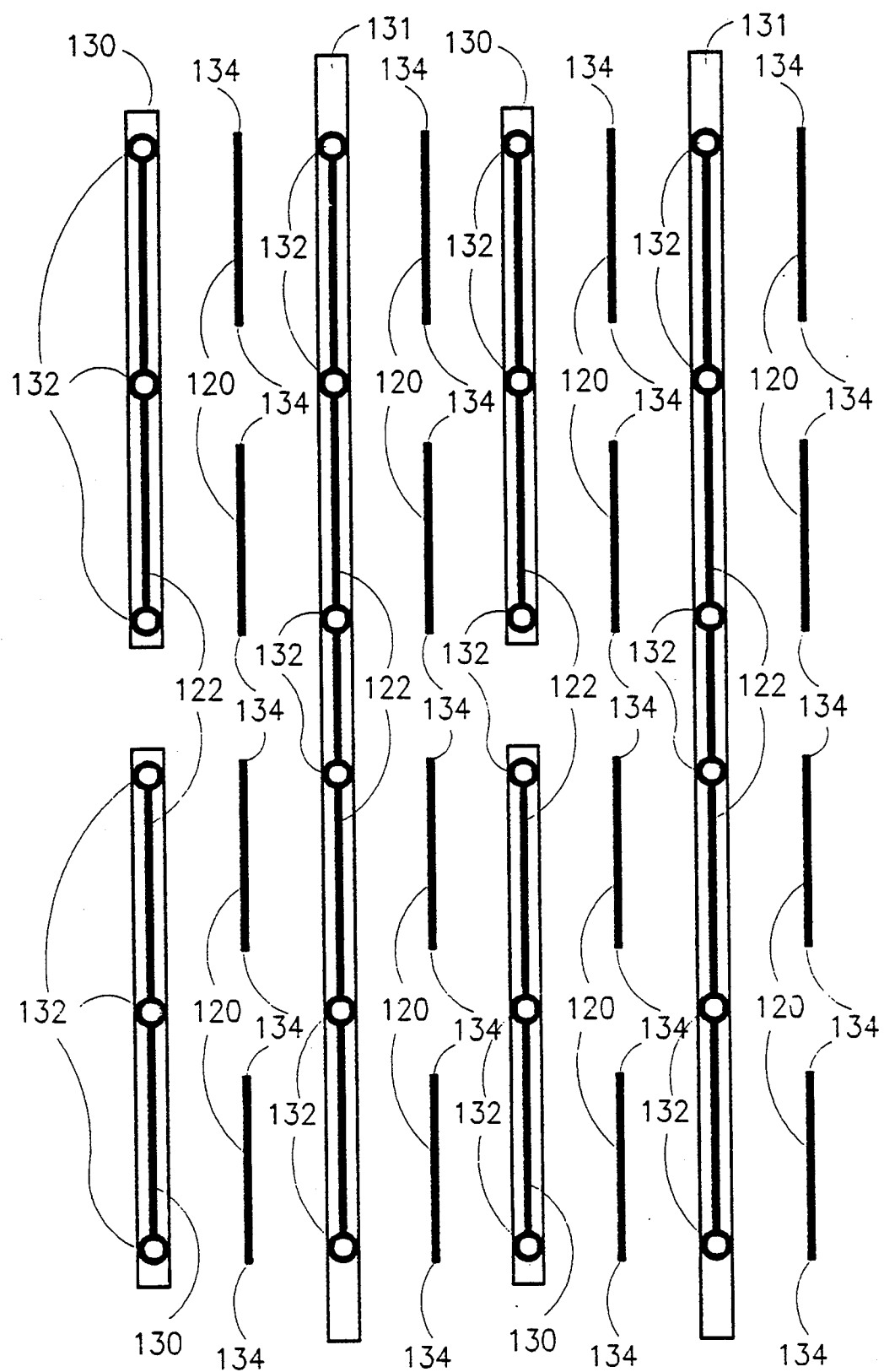
Figure 4C:
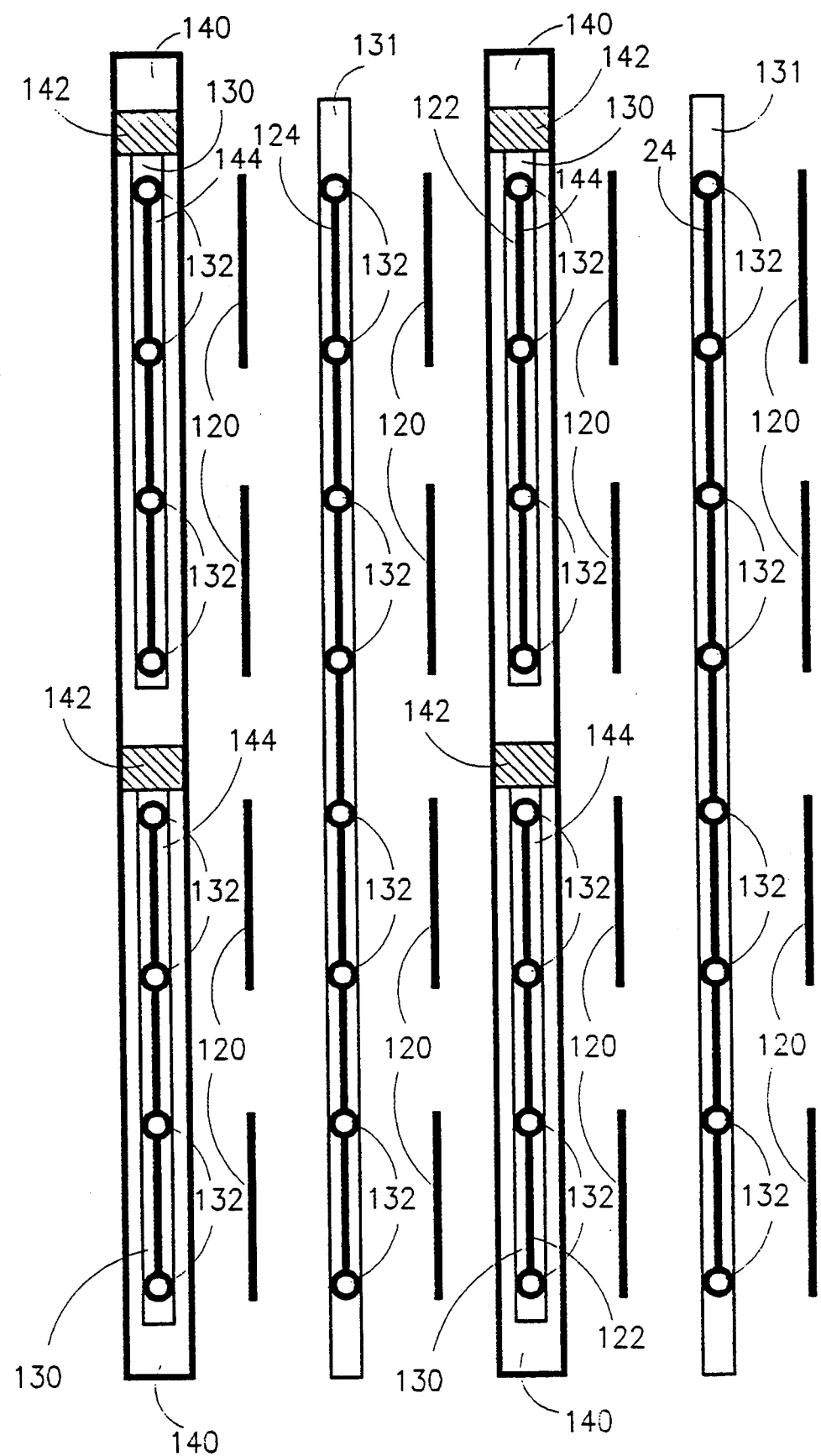

Reference is now made to FIGS. 4A-4C and 5 which illustrate the architecture of the EPROM array of the present invention. FIGS. 4A-4C are schematic illustration of layers of an EPROM array having the architecture of the present invention, from the lowest, diffusion layer to a second metal layer, where the later illustrations also include the previous layers. FIG. 5 is a circuit diagram of the EPROM array of the present invention.

As shown in FIG. 4A, the EPROM array typically comprises three types of diffusion lines, short, segmented diffusion lines 120, medium length, segmented diffusion lines 122 and continuous diffusion lines 124. Medium length diffusion lines 122 have a length of slightly larger than an integral multiple, typically 1-4, of short diffusion lines 120. The diffusion lines are arranged in repeated groups of four as follows: medium length diffusion lines 122, short diffusion lines 120, continuous diffusion lines 124 and short diffusion lines 120.

The EPROM array also comprises metal 1 lines 130 and 131 (FIG. 4B) of a first metal layer laid over the medium length diffusion lines 122 and the continuous diffusion lines 124. The metal 1 lines 130 and 131 respectively connect to the diffusion lines 122 and 124 below them via contacts 132 located at positions corresponding with end locations 134 of each short diffusion line 120.

Furthermore, the EPROM array comprises metal 2 lines 140 (FIG. 4C) of a second metal layer laid over the medium length diffusion lines 122 only. The metal 2 lines 140 connect to the metal 1 lines 130 through vias 142, located near one end 144 of each medium length diffusion line 122.

As shown in FIG. 5, the diffusion lines 120–124 provide the structure for three types of areas, EPROM areas 150 comprising a plurality of EPROM cells 152, segment select areas 154 for activating columns 156 of EPROM cells 152, and block select areas 158 for activating a block of EPROM areas 150. A block of EPROM areas 150 typically comprises two neighboring EPROM areas 150.

Each column 156 of EPROM cells is typically located between any neighboring two diffusion lines 120–124, wherein the cells 152 themselves are grouped within the EPROM areas 150.

A column 156 of EPROM cells typically comprises 64 cells, connected together through one of the diffusion lines 120–124. Rows of EPROM cells 152 are connected together with word lines WL. FIG. 5 labels the word lines WLi+k and WLj+k, where k=0 to 63, i=n and j=n+1.

Each block select area 158 typically comprises a row of block transistors 162, typically n-channel transistors, each selectively connecting one metal 2 line 140 with the metal 1 line 130 below it. The block select areas 158 are located wherever vias 142 (FIG. 4C) are located.

The block transistors 162 are connected together via block select lines BLOCKk, where, for a 1 Mbit array, k typically varies from 0 to 7. When one block select line BLOCKk is activated, a row of blocks of EPROM areas 150 are potentially activated.

Each segment select area 154 typically comprises a row of segment select transistors 160 and 161, typically floating gate transistors, each selectively connecting one short diffusion line 120, to which no metal is strapped, to a neighboring diffusion line 122 or 124, respectively, which is metal-strapped. Segment select areas 154 are located wherever contacts 132 are located, near each end 134 of each short diffusion line 120.

The segment select transistors 160 and 161 are connected together via segment select lines SELeven or SELodd, respectively and, as in the prior art, a pair of segment select transistors 160 or 161 are required to activate a column of EPROM cells 152.

In accordance with a preferred embodiment of the present invention, the continuous diffusion lines 124 are dedicated to be source lines during reading whereas during programming, any of the metal-strapped diffusion lines 122 or 124 becomes the source line which is then transferred to the short diffusion lines 120.

As will be described in more detail hereinbelow, dedicating the continuous diffusion lines 124 to be source lines provides a fast reading method.

Figure 6:
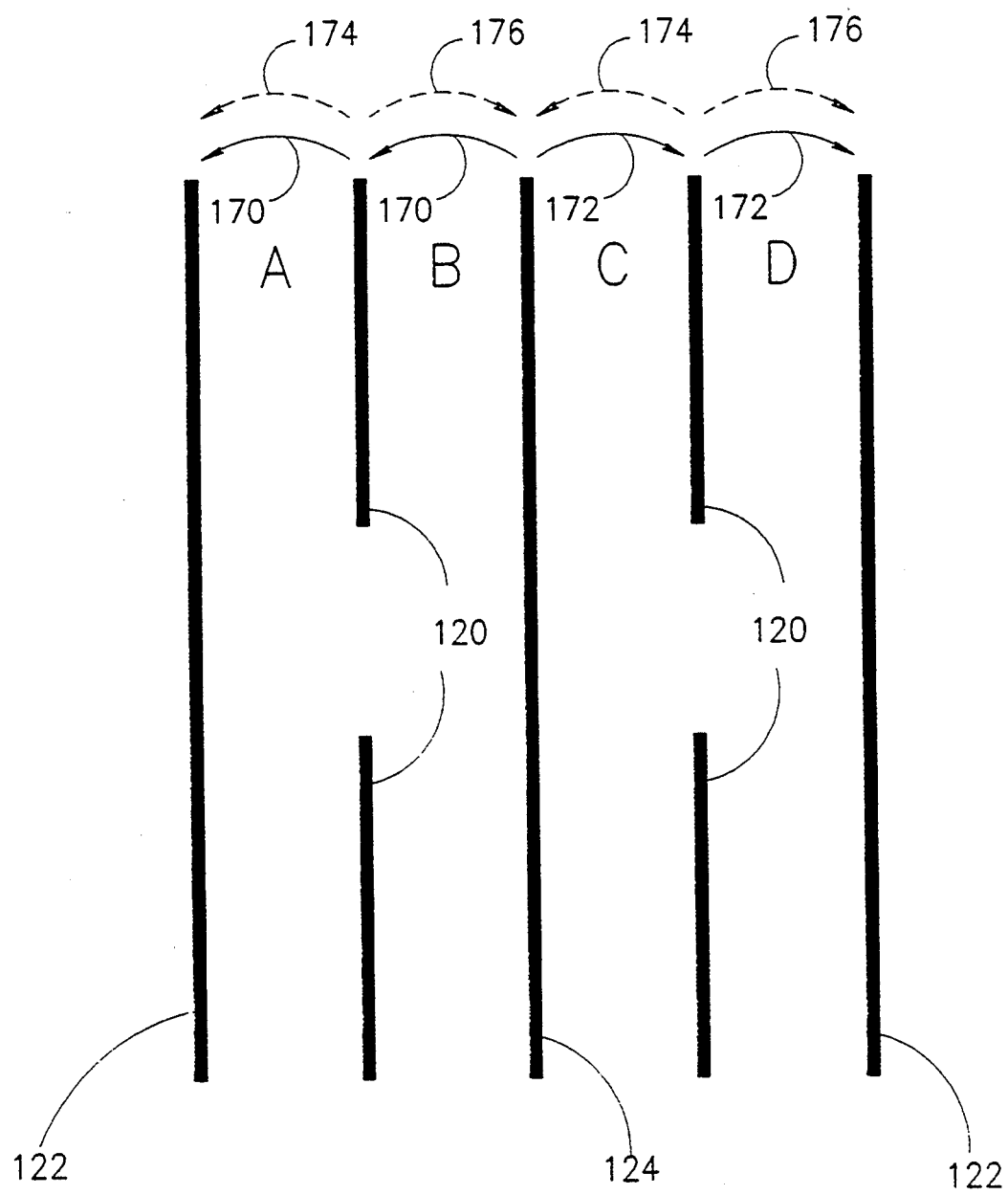
FIG. 6 is a schematic illustration of four types of columns of EPROM cells between five diffusion lines, indicating the directions of reading and programming, useful in understanding the operation of the EPROM array of FIG. 5.

The reading and programming method of the present invention results in columns of EPROM cells 152 being read and programmed in different directions, detailed in FIG. 6 to which reference is now made. The read operation is indicated by solid arrows 170 and 172 in first and second opposing directions. The programming operation, indicated by dashed arrows 174 and 176, also occurs in the first and second opposing directions. For all arrows, the head of the arrow indicates the location of the drain and the base of the arrow indicates the location of the source.

As can be seen, the different reading and programming directions produces four types of columns of cells, labeled A–D in FIGS. 5 and 6. Column type A is read and programmed in the first direction, column type B is read in the first direction and programmed in the second direction, column type C is read in the second direction and programmed in the first direction and column type D is read and programmed in the second direction.

More specifically, column type A has a medium length diffusion line 122 to its left and a short diffusion line 120 to its right (for this discussion, "right" and "left" are as shown in FIG. 5). Column type B has a short diffusion line 122 to its left and a continuous diffusion line 124 to its right. Column type C has a continuous diffusion line 124 to its left and a short diffusion line 120 to its right. Column type D has a short diffusion line 122 to its left and a medium length diffusion line 122 to its right.

An EPROM cell 152 which is to be read requires that one of the diffusion lines 120–124 next to it have a drain voltage and one have a source voltage. Since each EPROM cell 152 has a non-metal-strapped diffusion line (e.g. a short diffusion line 120) as one of its neighboring diffusion lines, in order to read the contents of the cell 152, either the drain or the source voltage has to be transferred from a metal-strapped diffusion line 122 or 124 to the neighboring diffusion line 120, via an appropriate segment select transistor 160 or 161, respectively.

Thus, during reading, column types B and C of the selected block have the drain voltage transferred, by a segment select transistor 161 or 160, respectively, from nearby medium length diffusion lines 122 to their respective short diffusion lines 120. Column types A and D of the selected block have the source voltage transferred, by a segment select transistor 160 or 161, respectively, from a nearby continuous diffusion line 124 to their respective short diffusion lines 120.

However, since the segment select transistors 160 and 161 must fit between two neighboring diffusion lines, they are not strong enough to transfer the high drain voltage of programming. Therefore, during programming, the drain voltage cannot be transferred. As a result, the drain voltage of an EPROM cell 152 is provided on the metal-strapped diffusion line, either line 122 or line 124, abutting the selected EPROM cell and the source voltage, which is typically of 0 volts, is transferred to the neighboring short diffusion line 120 from the other metal-strapped diffusion line, either line 124 or line 122, nearby. In other words, the metal-strapped diffusion lines 122 and 124 operate as virtual ground source and drain lines, as necessary.

Thus, during programming, column types B and D of the selected block have the source voltage transferred, by a segment select transistor 160 to their respective short diffusion lines 120 from nearby medium length and continuous diffusion lines 122 and 124, respectively.

Column types A and C of the selected block have the source voltage transferred, by a segment select transistor 161 to their respective short diffusion lines 120 from nearby continuous and medium length diffusion lines 124 and 122, respectively.

Table 1 summarizes the above discussion and provides the voltages of the metal-strapped lines 122 and 124 (labeled M2 and M1, respectively) and the segment select lines SELodd and SELeven. It is noted that "M2 Left" and "M2 Right" indicate the diffusion lines 122 to the left or right of the column being accessed, as illustrated in FIG. 6.

The select lines are either at ground (GND) when the select transistors are to be inactive, or at Vcc during reading or Vpp during programming when the select transistors are to be activated. The diffusion line which becomes the source is grounded and that of the drain has 7 V during programming. For reading, all medium length diffusion lines are kept at 2 V and the selected one is connected to a sense amplifier (SA) (not shown). In Table 1, the diffusion lines are noted by the metal lines (M1 or M2) which strap them. It is further noted that SELeven activates segment select transistors 160 and SELodd activates segment select transistors 161.

TABLE 1

| | | Operations for Reading and Programming | | | | |
|---|---|---|---|---|---|---|
| Operation | Cell | SEL even k | SEL odd k | M2 Left | M2 Right | M1 |
| Read | A | GND | Vcc | 2V (SA) | 2V | GND |
| | B | Vcc | GND | 2V (SA) | 2V | GND |
| | C | GND | Vcc | 2V | 2V (SA) | GND |
| | D | Vcc | GND | 2V | 2V (SA) | GND |
| Program | A | GND | Vpp | 7V | float | GND |
| | B | Vpp | GND | GND | float | 7V |
| | C | GND | Vpp | GND | 7V | float |
| | D | Vpp | GND | 7V | GND | float |

Figure 7B:
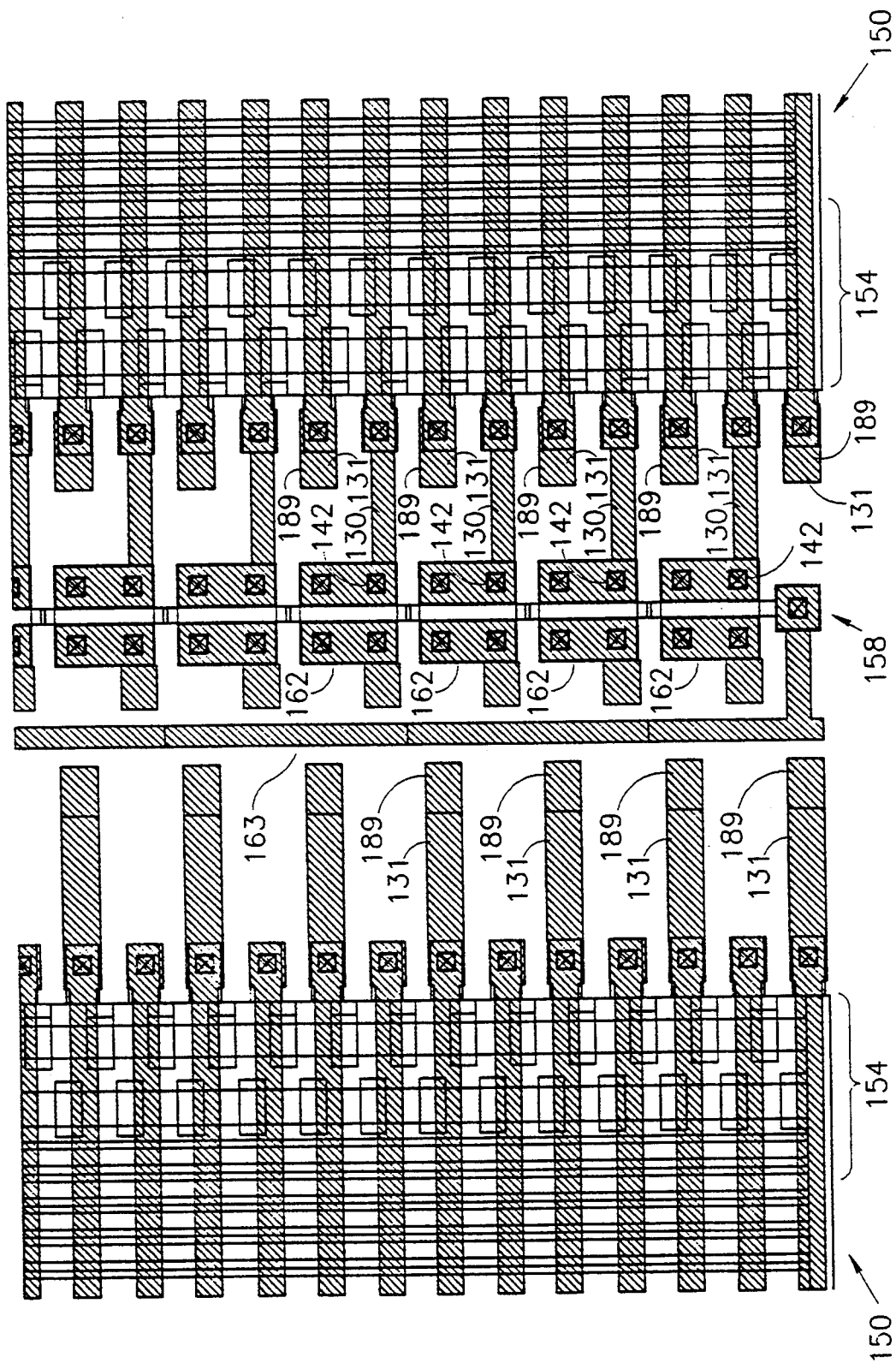
Figure 7C:
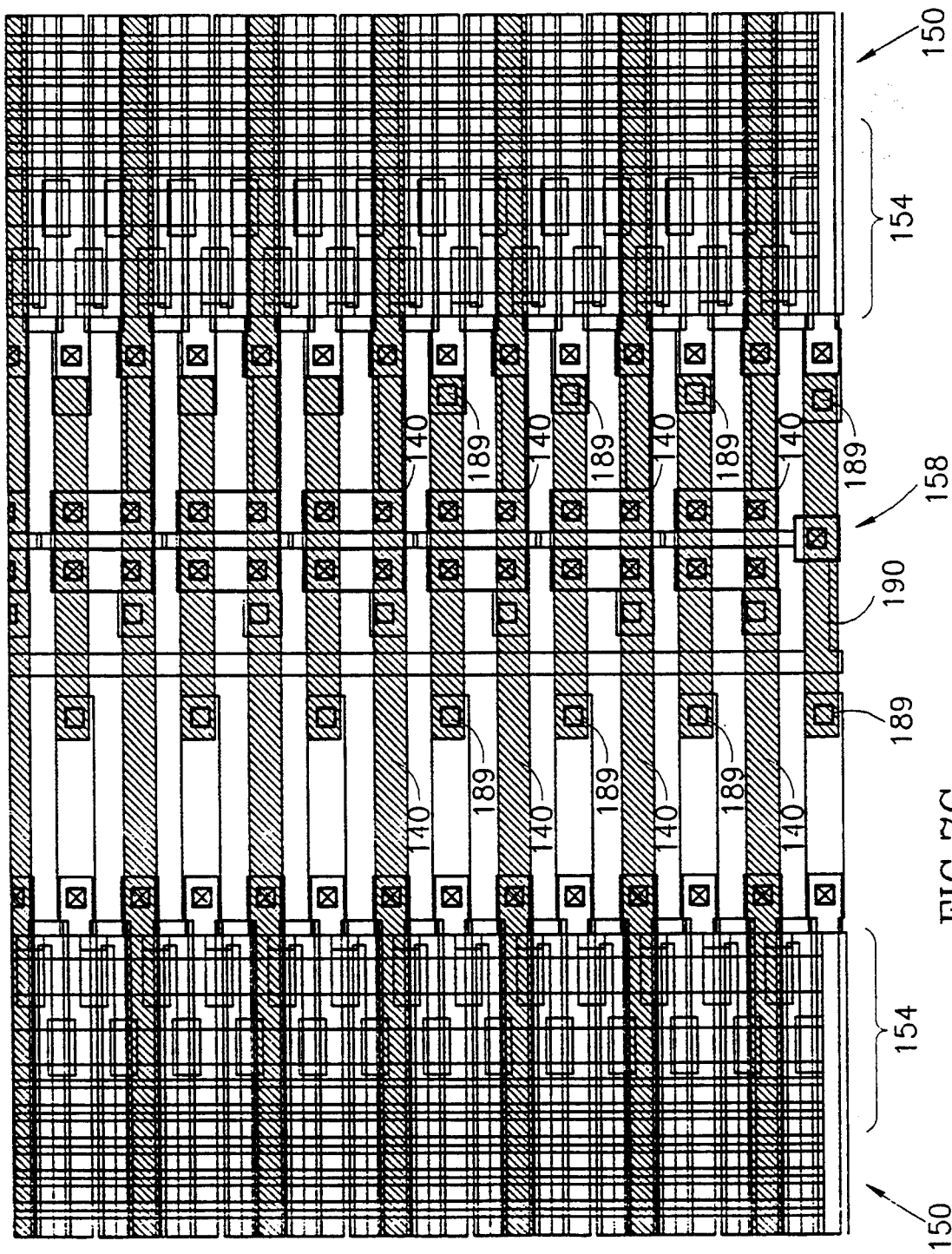
Figure 7D:
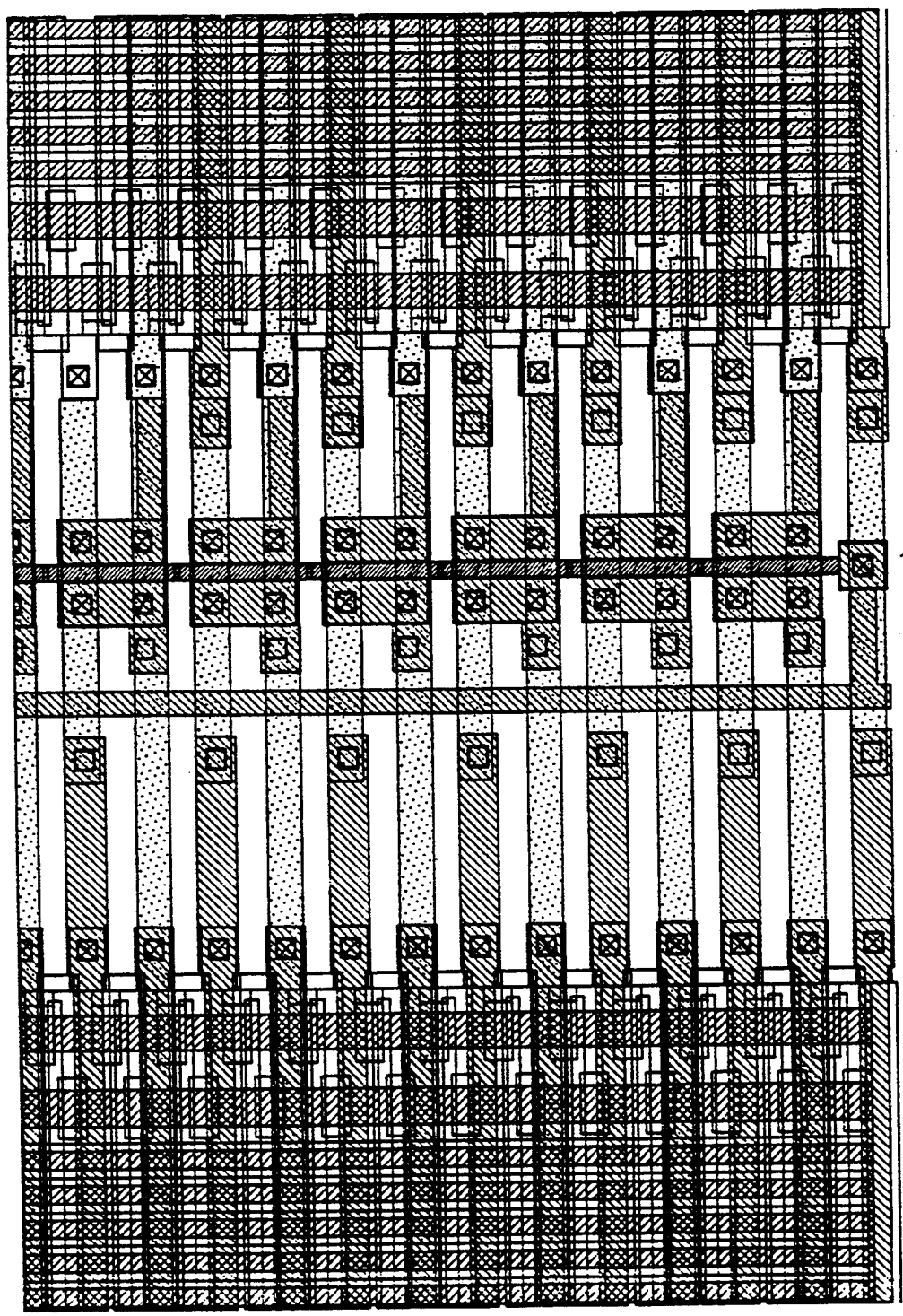
FIG. 7D is a layout illustration of the entirety of layers for the block select area of FIGS. 7A, 7B and 7C.
Figure 7E:
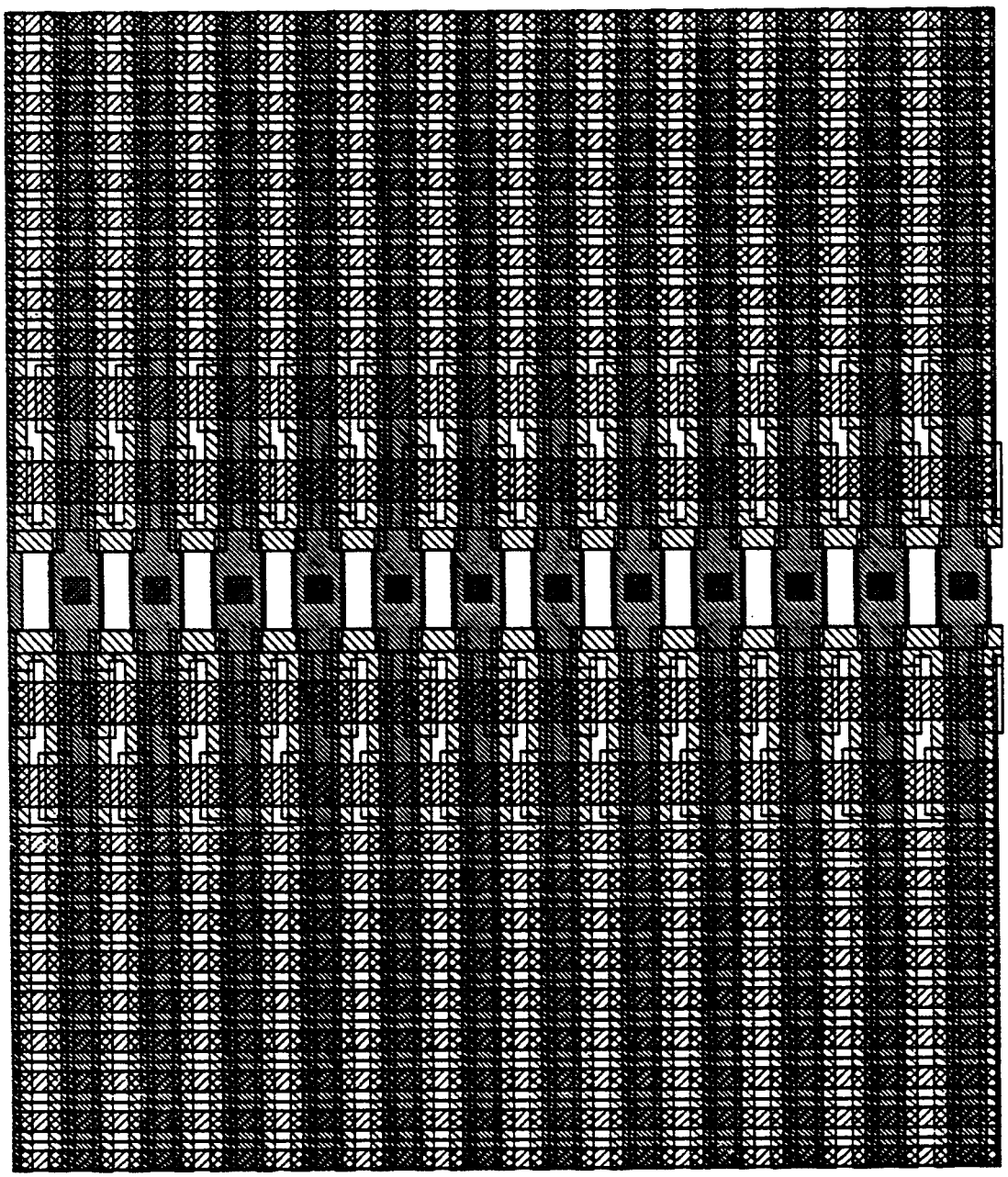
FIG. 7E is a layout illustration, similar to FIG. 7D but for a column select area.

The reading and programming methods described hereinabove are only operative for the block of EPROM cells 152 which has been activated by a block transistor 162. Thus, the "M2 Left" and "M2 Right" lines 122 can only receive voltage if the corresponding block transistor 162 has been activated by a signal on the BLOCKk line. Reference is now additionally made to FIGS. 7A–7E which are illustrations of portions of the layout of the layers of the EPROM array near one block select area 158. FIGS. 7A–7C roughly correspond to the layers shown in FIGS. 4A–4C. FIG. 7D shows the full layout for the block select area 158 and FIG. 7E shows the full layout for a segment select area 154.

The details of producing the EPROM and segment select areas 150 and 154 are provided in U.S. Pat. Nos. 5,151,375 and 5,204,835 which is incorporated herein by reference and will therefore, not be described herein. However, it is briefly noted that EPROM cells are formed of two polysilicon layers (called "poly 1" and "poly 2") laid over a silicon substrate and n-channel transistors are formed of a poly 2 layer laid over a silicon substrate. The diffusion lines are implantations into the silicon substrate aligned with lines of the poly 1 layer. Field oxides are utilized to isolate between segment select transistors 160 and 161.

FIG. 7A illustrates the diffusion, poly 1, poly 2, and field oxide isolation layers. FIG. 7A details poly 1 lines 186 formed, in the block select area 158, in the shape of a U. Diffusion lines are formed in the spaces next to the poly 1 lines 186, where the diffusion lines within the U are short diffusion lines 120 and those between U's, labeled 180, will form the metal-strapped diffusion lines 122 and 124.

FIG. 7A shows that each block transistor 162 is formed of a unit 182, each the width of four diffusion bit lines, two short diffusion lines 120 and two diffusions 180. It also shows that, since the block select transistors 162 occupy the space of more than one diffusion, the entirety of diffusions 180 are segmented and thus, do not interfere with the block select transistors 162. FIG. 7C indicates that metal 2 lines 190 are utilized to connect neighboring ends of some diffusions 180, thereby to create the continuous diffusion lines 124. FIG. 7A additionally details the field oxides 184, poly 1 lines 186 and poly 2 lines 188.

The block transistors 162 are wide because they have to transfer the drain current during programming. For example, for drain currents of 500 microamps, an n-channel transistor can be as little as 5–6 $\mu$m wide. If the diffusions 180 are 0.9 $\mu$m wide with 0.9 $\mu$m space between them, then the units 182 are at least 5.4 $\mu$m wide. Thus, the architecture of the present invention provides n-channel transistors which are large enough for programming.

FIG. 7B illustrates the deposition of the metal 1 layer over the layers shown in FIG. 7A. The lines of metal 1 are laid over every diffusion 180. Half of the metal lines are lines 130 laid over those diffusions which will become the medium length diffusion lines 122 and the rest are lines 131 laid over those diffusions which will become the continuous diffusion lines 124.

Lines 130 end in vias 142 and lines 131 end in contacts 189 to which lines 190 (FIG. 7C) will be connected. A line 163 connects the block transistors 162 to two places on either side of the array, thereby significantly reducing the RC delay of the transistors.

FIG. 7C illustrates the deposition of the metal 2 layer over the layers shown in FIGS. 7A and 7B. Metal lines 190 connect between contacts 189. Metal lines 140 continue across the whole array with vias 142 at the appropriate block transistor 162.

FIG. 7D is a final layout of a block select area 158. FIG. 7E shows the same layers as FIG. 7D for a segment select area 154 and shows that the poly 1 layer 186 in the segment select area 154 is also in the shape of a U. This creates the other end of short diffusion lines 120. The medium length diffusion lines 122 are not segmented in segment select areas 154. Both the medium length and continuous diffusion lines 122 and 124, respectively, have contacts 132 thereon. Medium length diffusion lines 122 are strapped by metal 1 and metal 2 lines 130 and 140, respectively. Continuous diffusion lines 124 are strapped by metal 1 lines 131 only.

As was mentioned hereinabove, the reading and programming methods are only operative for the block of EPROM cells 152 which has been activated by a block transistor 162. When the block transistor 162 is not active, the block is disconnected from the voltage sources in the EPROM array and, since each block of cells 152 is capacitive, while the block of cells 152 is disconnected, at least some of the charge stored therein dissipates. When a block is selected, before one of its cells can be read, the block must be returned, or "precharged" as it is known in the art, to an initial charge level. This requires a voltage reference source and a pull-up transistor. To pre-charge the whole EPROM array within a reasonable amount of time would require a large pull-up transistor which takes a significant amount of silicon real-estate. Such a large pull-up transistor would also cause a power surge from the power supply. The power surge reduces the internal supply of power and slows the device even further.

Alternatively, a small pull-up transistor could be utilized, but then the pre-charge time would be unreasonable.

Figure 8:
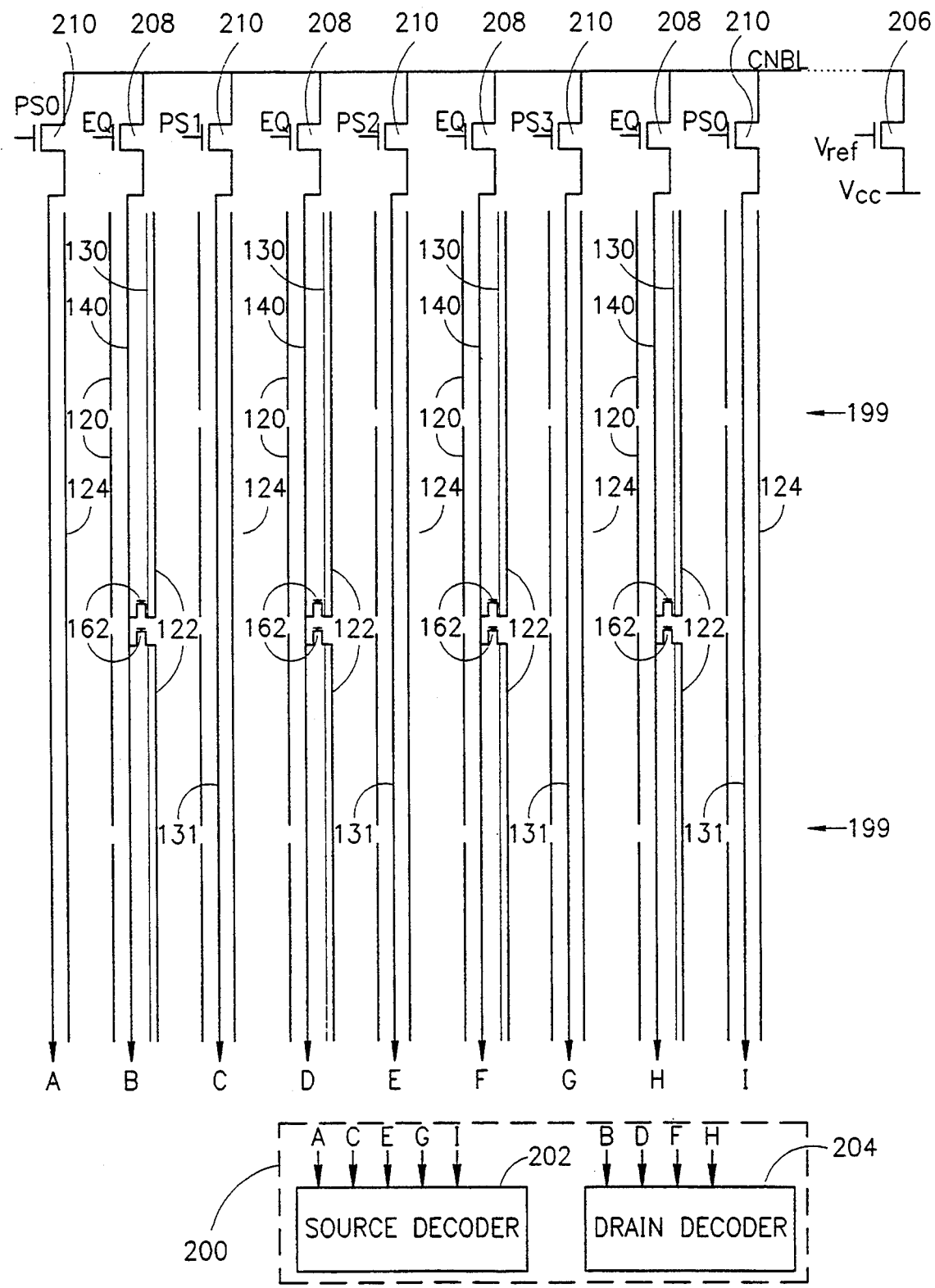
FIG. 8 is a circuit diagram of a two block array illustrating pre-charge apparatus of the present invention.

An alternative embodiment is shown in FIG. 8 wherein, for the purposes of illustration only, two small blocks 199 of an EPROM array are shown as are other elements useful in the pre-charging operation. The present invention additionally comprises a column multiplexer 200, separated during reading into a source decoder 202 and a drain decoder 204, a pull-up transistor 206 connected to a common bit line (CNBL) line, equalization (EQ) transistors 208 controlled by an EQ line and a pull-up source (PS) transistors 210, each controlled by one of a plurality of PSi lines, where i varies from 0 to 3 in the example shown in FIG. 8.

The EQ transistors 208 are attached between the CNBL line and the metal 2 lines 140 (read lines during reading) of the medium length diffusion lines 122. The PS transistors 210 are attached between the CNBL line and the metal 1 lines 131 (source lines during reading) of the continuous diffusion lines 124.

The metal 1 lines 131 are connected to the source decoder 202 and the metal 2 lines 140 are connected to the drain decoder 204.

Through the PSi lines, the PS transistors 210 and their corresponding continuous diffusion lines 124 are divided into groups. Generally, only one group is inactive at one time, becoming so when an address selection signal is provided. The other groups remain active, providing charge from the CNBL line through the metal 1 lines 131 to the continuous diffusion lines 124.

Of the disconnected group of continuous diffusion lines 124, typically eight of them (1 byte) are utilized during the reading operation. The remainder are connected to each other and to the active continuous diffusion lines 124 through the source decoder 202.

When an address selection signal is provided, the block transistors 162 for the selected block are activated, as are the EQ transistors 208. Since the selected block has, until activation of the block transistors 162, been disconnected from sources of charge it thus must be recharged before a read operation can occur.

The pull-up transistor 206 is always active, typically due to application of a Vref signal, and charge is thus allowed to flow from a charge source having a voltage of Vcc. Due to space considerations, the pull-up transistor 206 cannot be very large or very strong. Moreover, it typically operates to maintain the CNBL line at 2 V with an activation signal Vref of only 3 V. Such a transistor cannot pre-charge the block within a desired pre-charge time of 5 ns without other sources of charge.

In accordance with the present invention, there are other sources of charge within the EPROM array of the present invention. One source is those of the continuous diffusion lines 124 whose PS transistors 210 are active. In the example shown in FIG. 8, three-quarters of the continuous diffusion lines 124 have charge at any one time and are thus available to provide charge during pre-charging.

Of the remaining quarter of the continuous diffusion lines 124, only eight are discharged. The rest are connected through the column multiplexer 200 to the CNBL line.

Another source of charge is those of the disconnected continuous diffusion lines 124 which are not selected for the reading operation.

Other smaller sources of charge are the charge stored in the source and drain decoders 202 and 204, respectively and the charge stored in the metal 2 lines 140 due to their capacitance and their long length.

Thus, when the EQ transistors 208 connect the medium length diffusion lines 122 to the CNBL line, charge flows from the pull-up transistor 206 and from the sources of charge, described hereinabove, within the EPROM array.

For example, a 1 Mbit EPROM array has 1024 diffusion lines, 256 of which are the continuous diffusion lines 124. It is also typically divided into eight blocks. At any given time, 192 continuous diffusion lines 124 are continually charged and 56 continuous diffusion lines 124 are available to provide charge through the source decoder 202. There are the equivalent of 32 medium length diffusion lines 122 in each block which must be recharged.

If each block has 128 EPROM cells 152 per column and 512 columns, each with a capacitance of 2fF, then the whole block has a capacitance of approximately 131pF. To precharge such a block within a desired short length of time to a desired voltage, for example, 5 ns and 2 V, respectively, requires an average current of approximately 60 mA, with a peak current of 6-300 mA. Such a current is provided in the present invention, not from the pull-up transistor 206 alone which has a small drive since its gate is controlled by Vref (3 V), but from the sources of charge listed above which are connected together through the EQ and PS transistors 208 and 210, respectively, all of whose gates are at Vcc (5 V).

It will be appreciated that the elements of the present invention which are operative during the pre-charge operation enable it to last a relatively short length of time.

While the EPROM array is being pre-charged, the eight EPROM cells 152 to be read are selected and voltage is provided on the word line WL defining the row of the EPROM cells 152. This is opposite to the virtual ground prior art wherein the drain and source lines are selected, by providing voltage and discharging, respectively, only once the voltage on the word line WL has "ramped up" to its full value. This is a time-consuming process, especially if, as is the case here, the pre-charging already takes a significant amount of time (the pre-charging time is reduced by utilizing the charge stored in the array by the continuous diffusion lines 124; however, it still takes time).

Therefore, to further increase the speed of reading, during reading only, the selected source lines (e.g. eight continuous diffusion lines 124 whose PS transistors 210 are already inactive) are selected and discharged by the source decoder 202 while the word line WL is ramping up to its full charge level. Once pre-charging has finished, all of the possible drain lines (i.e. the medium length diffusion lines 122) are already fully charged. They are then selected by the drain decoder 204.

During programming, speed is of little concern and therefore, there is no need to discharge the source line during word line ramp-up. The addressing for programming is performed by the source and drain decoders 202 and 204, respectively, together.

It will be appreciated that, contrary to the prior art, the present invention provides an EPROM array architecture which enables fast reading (due to the pre-charge and line select method and the reduced bit line capacitance due to segmentation) without a significant cost in silicon real-estate (due to the fact that the block select areas add only 10% to the size of the array).

It will be appreciated by persons skilled in the art that the present invention is not limited to what has been particularly shown and described hereinabove. Rather the scope of the present invention is defined by the claims which follow:

We claim:

1. An electrically programmable read only memory (EPROM) array comprising:
   first metal lines of a first metal layer formed into segmented first metal lines and continuous first metal lines;
   second metal lines of a second metal layer;
   diffusion lines formed of diffusions and comprised of:
   short diffusion lines which are formed of short segments of diffusions;
   continuous diffusion lines each of which is associated with one continuous first metal line;
   medium length diffusion lines which are formed of medium length segments of diffusions, each of which is associated with one segmented first metal line and one second metal line,
   wherein the diffusion lines repeat in the following order: medium length, short, continuous, short;
   columns of EPROM cells, each column located between two neighboring diffusion lines;
   segment select transistors each of which connects one short diffusion line to one first metal line; and
   block select transistors each of which connects one segmented first metal line to one second metal line.

2. An EPROM array according to claim 1 wherein when accessing a single EPROM cell, read and source lines are selected as any neighboring continuous and medium length diffusion lines, wherein during reading, said continuous diffusion lines form the source lines and the medium length diffusion lines form the read lines and, during programming, the short diffusion lines receive the source voltage from one of the continuous and medium length diffusion lines.

3. An EPROM array according to claim 1 wherein said columns of EPROM cells are formed into first, second, third and fourth groups and wherein said array additionally comprises a controller for controlling the read and program directions of said groups, wherein said controller reads and programs said first group in a first direction, reads said second group in said first direction and programs it in a second direction, reads said third group in said second direction and programs it in said first direction and reads and programs said fourth group in said second direction.

4. An EPROM array according to claim 3 and wherein said first group is located between said medium length and short diffusion lines, said second group is located between said short and said continuous diffusion lines, said third group is located between said continuous and said short diffusion lines and said fourth group is located between said short and said medium length diffusion lines.

5. An electrically programmable read only memory (EPROM) array comprising:
   a multiplicity of columns of EPROM cells formed into first, second, third and fourth groups, wherein said groups repeat in the following order: first, second, third, fourth; and a controller for controlling the read and program directions of said groups;

wherein said controller reads and programs said first group in a first direction, reads said second group in said first direction and programs it in a second direction, reads said third group in said second direction and programs it in said first direction and reads and programs said fourth group in said second direction.

6. An EPROM array according to claim 5 and additionally comprising:

first metal lines of a first metal layer formed into segmented first metal lines and continuous first metal lines;

second metal lines of a second metal layer; and diffusion lines formed of diffusions and comprised of:
short diffusion lines which are formed of short segments of diffusions;
continuous diffusion lines each of which is associated with one continuous first metal line;
medium length diffusion lines which are formed of medium length segments of diffusions, each of which is associated with one segmented first metal line and one second metal line,
wherein the diffusion lines repeat in the following order: medium length, short, continuous, short.

7. An EPROM array according to claim 6 and wherein said first group is located between said medium length and short diffusion lines, said second group is located between said short and said continuous diffusion lines, said third group is located between said continuous and said short diffusion lines and said fourth group is located between said short and said medium length diffusion lines.

8. An EPROM array according to claim 6 wherein when accessing a single EPROM cell, read and source lines are selected as any neighboring continuous and medium length diffusion lines, wherein during reading, said continuous diffusion lines form the source lines and the medium length diffusion lines form the read lines and, during programming, the short diffusion lines receive the source voltage from one of the continuous and medium length diffusion lines.

* * * * *